(12) United States Patent
Im et al.

(10) Patent No.: US 12,230,340 B2
(45) Date of Patent: Feb. 18, 2025

(54) SHIFT REGISTER UNIT, GATE DRIVING CIRCUIT AND DISPLAY DEVICE

(71) Applicant: BOE Technology Group Co., Ltd., Beijing (CN)

(72) Inventors: Yunsik Im, Beijing (CN); Shunhang Zhang, Beijing (CN); Fuqiang Li, Beijing (CN); Changfeng Li, Beijing (CN); Liwei Liu, Beijing (CN); Hehe Hu, Beijing (CN); Ce Ning, Beijing (CN); Hui Zhang, Beijing (CN); Hongrun Wang, Beijing (CN); Zhuo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/996,293

(22) PCT Filed: Nov. 30, 2021

(86) PCT No.: PCT/CN2021/134504
§ 371 (c)(1),
(2) Date: Oct. 14, 2022

(87) PCT Pub. No.: WO2023/097477
PCT Pub. Date: Jun. 8, 2023

(65) Prior Publication Data
US 2024/0221851 A1  Jul. 4, 2024

(51) Int. Cl.
*G11C 19/28*  (2006.01)
*G09G 3/20*   (2006.01)
(Continued)

(52) U.S. Cl.
CPC ............... *G11C 19/28* (2013.01); *G09G 3/20* (2013.01); *G09G 3/3266* (2013.01);
(Continued)

(58) Field of Classification Search
CPC ........ G11C 19/28; G09G 3/20; G09G 3/3266; G09G 3/3677; G09G 2310/0286
See application file for complete search history.

(56) References Cited

U.S. PATENT DOCUMENTS

2014/0078127 A1   3/2014  Lin et al.
2020/0184872 A1*  6/2020  Yuan .................... G09G 3/3677
(Continued)

FOREIGN PATENT DOCUMENTS

CN    105047119 A    11/2015
CN    109285496 A    1/2019
(Continued)

*Primary Examiner* — Patrick O Neill
(74) *Attorney, Agent, or Firm* — Nath, Goldberg & Meyer; Joshua B. Goldberg

(57) ABSTRACT

The present disclosure provides a shift register unit, a gate driving circuit and a display device. The shift register unit provided by the present disclosure includes: an input sub-circuit, an output sub-circuit, at least one pull-down control sub-circuit, at least one pull-down sub-circuit, at least one first noise reduction sub-circuit, and a reverse bias sub-circuit; the reverse bias sub-circuit is configured to control transistors in at least part of sub-circuits connected to a pull-up node to be in a reverse bias state through a power voltage signal in response to a potential of the pull-up node, or control the transistors in at least part of the sub-circuits connected to the pull-up node to be in the reverse bias state through a cascade signal in response to a potential of a cascade signal terminal.

6 Claims, 2 Drawing Sheets

(51) Int. Cl.
  *G09G 3/3266* (2016.01)
  *G09G 3/36* (2006.01)
(52) U.S. Cl.
  CPC ... *G09G 3/3677* (2013.01); *G09G 2310/0267* (2013.01); *G09G 2310/0286* (2013.01)

(56) References Cited

U.S. PATENT DOCUMENTS

| | | | | |
|---|---|---|---|---|
| 2021/0118347 | A1* | 4/2021 | Wang | G09G 3/3266 |
| 2021/0295778 | A1* | 9/2021 | Feng | G11C 19/28 |
| 2021/0327363 | A1* | 10/2021 | Feng | G11C 19/28 |

FOREIGN PATENT DOCUMENTS

| | | | |
|---|---|---|---|
| CN | 109935196 | A | 6/2019 |
| CN | 109935200 | A | 6/2019 |
| CN | 109935208 | A | 6/2019 |
| CN | 110148383 | A | 8/2019 |
| CN | 110189694 | A | 8/2019 |
| CN | 113066446 | A | 7/2021 |
| CN | 113113070 | A | 7/2021 |

* cited by examiner

--Prior Art--

SHIFT REGISTER UNIT, GATE DRIVING CIRCUIT AND DISPLAY DEVICE

This is a National Phase Application filed under 35 U.S.C. 371 as a national stage of PCT/CN2021/134504, filed Nov. 30, 2021 the content of which is hereby incorporated by reference in its entirety.

TECHNICAL FIELD

The present disclosure relates to the field of display technology, and particularly relates to a shift register unit, a gate driving circuit and a display device.

BACKGROUND

The Gate Driver On Array (GOA) technology can integrate a gate driving circuit on an array substrate of a display panel. Compared with the traditional Chip On Film (COF) process or Chip On Glass (COG) process, the GOA technology can not only save cost, but also achieve aesthetic symmetric design of two sides of the display panel; meanwhile, the GOA technology can omit a bonding region and a peripheral wiring space of the gate driving circuit, thereby realizing a narrow-bezel design of display devices and improving production capacity and yield of the display devices.

A material of active layers of thin film transistors used in a GOA circuit may be amorphous silicon (a-Si), low temperature polysilicon (LTPS) or metal oxide semiconductor such as the typical Indium Gallium Zinc Oxide (IGZO). Metal oxide transistors (e.g., thin film transistors having IGZO as the material of the active layer thereof) are generally used as the thin film transistors in a GOA circuit of a large-sized display screen; but as a size and resolution of a display are further increased, oxide thin film transistors with higher mobility are required to be applied to the GOA circuit. However, when the thin film transistors with higher mobility are used, threshold voltages of the thin film transistors are unstable and negative bias fluctuation of the threshold voltages are likely to occur, which causes the thin film transistors to generate leakage current. Thus, operating performance of the GOA circuit is affected, and a display panel driven by the GOA circuit is likely to have a problem of poor display.

SUMMARY

For solving at least one of the technical problems in the related art, the present disclosure provides a shift register unit, a gate driving circuit and a display device.

In a first aspect, an embodiment of the present disclosure provides a shift register unit, including: an input sub-circuit, an output sub-circuit, at least one pull-down control sub-circuit, at least one pull-down sub-circuit, at least one first noise reduction sub-circuit, and a reverse bias sub-circuit;

the input sub-circuit is configured to pull up a potential of a pull-up node through an input signal of a signal input terminal in response to the input signal; and the pull-up node is at least simultaneously connected to the input sub-circuit, the output sub-circuit, and the first noise reduction sub-circuit;

the output sub-circuit is configured to output a signal through a signal output terminal and output a signal through a cascade signal terminal in response to the potential of the pull-up node which is already pulled up;

the pull-down control sub-circuit is configured to control a potential of a pull-down node with a power voltage signal in response to the power voltage signal; and the pull-down node is at least simultaneously connected to the pull-down control sub-circuit, the pull-down sub-circuit, and the first noise reduction sub-circuit;

the pull-down sub-circuit is configured to pull down the potential of the pull-down node through a first reference level signal in response to the potential of the pull-up node and a potential of the signal input terminal;

the first noise reduction sub-circuit is configured to perform noise reduction on the potential of the pull-up node through the first reference level signal in response to the potential of the pull-down node; and the reverse bias sub-circuit is configured to control transistors in at least part of sub-circuits connected to the pull-up node to be in a reverse bias state through the power voltage signal in response to the potential of the pull-up node, or, control the transistors in at least part of the sub-circuits connected to the pull-up node to be in the reverse bias state through a cascade signal in response to a potential of the cascade signal terminal.

In some implementations, the reverse bias sub-circuit includes: a reverse bias control transistor; and the reverse bias control transistor has a control electrode connected to the pull-up node, a first electrode connected to a power voltage terminal, and a second electrode connected to the input sub-circuit and the first noise reduction sub-circuit.

In some implementations, the reverse bias sub-circuit includes: a reverse bias control transistor; and a control electrode and a first electrode of the reverse bias control transistor are both connected to the cascade signal terminal, and a second electrode of the reverse bias control transistor is connected to the input sub-circuit and the first noise reduction sub-circuit.

In some implementations, the input sub-circuit includes: at least two first transistors; and control electrodes of the two first transistors are both connected to the signal input terminal, a first one of the first transistors has a first electrode connected to the signal input terminal, and a second electrode connected to a first electrode of a second one of the first transistors and the reverse bias sub-circuit, and a second electrode of the second one of the first transistors is connected to the pull-up node.

In some implementations, the first noise reduction sub-circuit includes: at least two eighth transistors; and control electrodes of the two eighth transistors are both connected to the pull-down node, a first one of the eighth transistors has a first electrode connected to a first reference level terminal, and a second electrode connected to a first electrode of a second one of the eighth transistors and the reverse bias sub-circuit, and a second electrode of the second one of the eighth transistors is connected to the pull-up node.

In some implementations, the shift register unit further includes: a first reset sub-circuit; and the first reset sub-circuit is configured to reset the potential of the pull-up node through the first reference level signal in response to a reset signal.

In some implementations, the first reset sub-circuit includes: at least two second transistors; and control electrodes of the two second transistors are both connected to a reset signal terminal, a first one of the second transistors has a first electrode connected to a first reference level terminal, and a second electrode connected to a first electrode of a second one of the second transistors and the reverse bias sub-circuit, and a second electrode of the second one of the second transistors is connected to the pull-up node.

In some implementations, the shift register unit further includes: a shift reset sub-circuit; and the shift reset sub-circuit is configured to reset the potential of the pull-up node through the first reference level signal in response to a shift reset signal.

In some implementations, the shift reset sub-circuit includes: at least two fifteenth transistors; and control electrodes of the two fifteenth transistors are both connected to a shift reset signal terminal, a first one of the fifteenth transistors has a first electrode connected to a first reference level terminal, and a second electrode connected to a first electrode of a second one of the fifteenth transistors and the reverse bias sub-circuit, and a second electrode of the second one of the fifteenth transistors is connected to the pull-up node.

In some implementations, the shift register unit further includes: a second reset sub-circuit; and the second reset sub-circuit is configured to reset a potential of the signal output terminal through a second reference level signal in response to a reset signal.

In some implementations, the second reset sub-circuit includes: a fourth transistor; and the fourth transistor has a control electrode connected to a reset signal terminal, a first electrode connected to a second reference level terminal, and a second electrode connected to the signal output terminal.

In some implementations, the shift register unit further includes: at least one second noise reduction sub-circuit; and the second noise reduction sub-circuit is configured to perform noise reduction on a potential of the signal output terminal through a second reference level signal in response to the potential of the pull-down node.

In some implementations, the second noise reduction sub-circuit includes: a thirteenth transistor; and the thirteenth transistor has a control electrode connected to the pull-down node, a first electrode connected to a second reference level terminal, and a second electrode connected to the signal output terminal.

In some implementations, the shift register unit further includes: at least one third noise reduction sub-circuit; and the third noise reduction sub-circuit is configured to perform noise reduction on the potential of the cascade signal terminal through the first reference level signal in response to the potential of the pull-down node.

In some implementations, the third noise reduction sub-circuit includes: a twelfth transistor; and the twelfth transistor has a control electrode connected to the pull-down node, a first electrode connected to a first reference level terminal, and a second electrode connected to the cascade signal terminal.

In some implementations, the output sub-circuit includes: a third transistor, an eleventh transistor, and a storage capacitor;

the third transistor has a control electrode connected to the pull-up node, a first electrode connected to a clock signal terminal, and a second electrode connected to the signal output terminal;

the eleventh transistor has a control electrode connected to the pull-up node, a first electrode connected to the clock signal terminal, and a second electrode connected to the cascade signal terminal; and one terminal of the storage capacitor is connected to the pull-up node, and the other terminal of the storage capacitor is connected to the signal output terminal.

In some implementations, the pull-down control sub-circuit includes: a fifth transistor; and a control electrode and a first electrode of the fifth transistor are both connected to a power voltage terminal, and a second electrode of the fifth transistor is connected to the pull-down node.

In some implementations, the pull-down sub-circuit includes: a sixth transistor and a seventh transistor;

the sixth transistor has a control electrode connected to the pull-up node, a first electrode connected to a first reference level terminal, and a second electrode connected to the pull-down node; and the seventh transistor has a control electrode connected to the signal input terminal, a first electrode connected to the first reference level terminal, and a second electrode connected to the pull-down node.

In a second aspect, an embodiment of the present disclosure further provides a shift register unit, where the shift register unit includes: an input sub-circuit, an output sub-circuit, at least one pull-down control sub-circuit, at least one pull-down sub-circuit, at least one first noise reduction sub-circuit, at least one second noise reduction sub-circuit, at least one third noise reduction sub-circuit, a first reset sub-circuit, a second reset sub-circuit, a shift reset sub-circuit, and a reverse bias sub-circuit; a pull-up node is at least simultaneously connected to the input sub-circuit, the output sub-circuit, and the first noise reduction sub-circuit; and a pull-down node is at least simultaneously connected to the pull-down control sub-circuit, the pull-down sub-circuit, and the first noise reduction sub-circuit; and the input sub-circuit includes: at least two first transistors; the output sub-circuit includes: a third transistor, an eleventh transistor, and a storage capacitor; the pull-down control sub-circuit includes: a fifth transistor; the pull-down sub-circuit includes: a sixth transistor and a seventh transistor; the first noise reduction sub-circuit includes: at least two eighth transistors; the second noise reduction sub-circuit includes: a thirteenth transistor; the third noise reduction sub-circuit includes: a twelfth transistor; the first reset sub-circuit includes: at least two second transistors; the second reset sub-circuit includes: a fourth transistor; the shift reset sub-circuit includes: at least two fifteenth transistors; and the reverse bias sub-circuit includes: a reverse bias control transistor;

control electrodes of the two first transistors are both connected to a signal input terminal, a first one of the first transistors has a first electrode connected to the signal input terminal, and a second electrode connected to a first electrode of a second one of the first transistors and a second electrode of the reverse bias control transistor, and a second electrode of the second one of the first transistors is connected to the pull-up node;

the third transistor has a control electrode connected to the pull-up node, a first electrode connected to a clock signal terminal, and a second electrode connected to a signal output terminal;

the eleventh transistor has a control electrode connected to the pull-up node, a first electrode connected to the clock signal terminal, and a second electrode connected to a cascade signal terminal;

one terminal of the storage capacitor is connected to the pull-up node, and the other terminal of the storage capacitor is connected to the signal output terminal:

a control electrode and a first electrode of the fifth transistor are both connected to a power voltage terminal, and a second electrode of the fifth transistor is connected to the pull-down node;

the sixth transistor has a control electrode connected to the pull-up node, a first electrode connected to a first reference level terminal, and a second electrode connected to the pull-down node;

the seventh transistor has a control electrode connected to the signal input terminal, a first electrode connected to the first reference level terminal, and a second electrode connected to the pull-down node;

control electrodes of the two eighth transistors are both connected to the pull-down node, a first one of the eighth transistors has a first electrode connected to the first reference level terminal, and a second electrode connected to a first electrode of a second one of the eighth transistors and the second electrode of the reverse bias control transistor, and a second electrode of the second one of the eighth transistors is connected to the pull-up node;

the thirteenth transistor has a control electrode connected to the pull-down node, a first electrode connected to a second reference level terminal, and a second electrode connected to the signal output terminal;

the twelfth transistor has a control electrode connected to the pull-down node, a first electrode connected to the first reference level terminal, and a second electrode connected to the cascade signal terminal;

control electrodes of the two second transistors are both connected to a reset signal terminal, a first one of the second transistors has a first electrode connected to the first reference level terminal, and a second electrode connected to a first electrode of a second one of the second transistors and the reverse bias sub-circuit, and a second electrode of the second one of the second transistors is connected to the pull-up node;

the fourth transistor has a control electrode connected to the reset signal terminal, a first electrode connected to the second reference level terminal, and a second electrode connected to the signal output terminal;

control electrodes of the two fifteenth transistors are both connected to a shift reset signal terminal, a first one of the fifteenth transistors has a first electrode connected to the first reference level terminal, and a second electrode connected to a first electrode of a second one of the fifteenth transistors and the second electrode of the reverse bias control transistor, and a second electrode of the second one of the fifteenth transistors is connected to the pull-up node; and a control electrode of the reverse bias control transistor is connected to the pull-up node, a first electrode of the reverse bias control transistor is connected to the power voltage terminal, and the second electrode of the reverse bias control transistor is connected to the second electrode of the first one of the first transistors, the second electrode of the first one of the eighth transistors, the second electrode of the first one of the second transistors, and the second electrode of the first one of the fifteenth transistors.

In a third aspect, an embodiment of the present disclosure further provides a shift register unit, where the shift register unit includes: an input sub-circuit, an output sub-circuit, at least one pull-down control sub-circuit, at least one pull-down sub-circuit, at least one first noise reduction sub-circuit, at least one second noise reduction sub-circuit, at least one third noise reduction sub-circuit, a first reset sub-circuit, a second reset sub-circuit, a shift reset sub-circuit, and a reverse bias sub-circuit; a pull-up node is at least simultaneously connected to the input sub-circuit, the output sub-circuit, and the first noise reduction sub-circuit; and a pull-down node is at least simultaneously connected to the pull-down control sub-circuit, the pull-down sub-circuit, and the first noise reduction sub-circuit; and the input sub-circuit includes: at least two first transistors; the output sub-circuit includes: a third transistor, an eleventh transistor, and a storage capacitor; the pull-down control sub-circuit includes: a fifth transistor; the pull-down sub-circuit includes: a sixth transistor and a seventh transistor; the first noise reduction sub-circuit includes: at least two eighth transistors; the second noise reduction sub-circuit includes: a thirteenth transistor; the third noise reduction sub-circuit includes: a twelfth transistor; the first reset sub-circuit includes: at least two second transistors; the second reset sub-circuit includes: a fourth transistor; the shift reset sub-circuit includes: at least two fifteenth transistors; and the reverse bias sub-circuit includes: a reverse bias control transistor;

control electrodes of the two first transistors are both connected to a signal input terminal, a first one of the first transistors has a first electrode connected to the signal input terminal, and a second electrode connected to a first electrode of a second one of the first transistors and a second electrode of the reverse bias control transistor, and a second electrode of the second one of the first transistors is connected to the pull-up node;

the third transistor has a control electrode connected to the pull-up node, a first electrode connected to a clock signal terminal, and a second electrode connected to a signal output terminal;

the eleventh transistor has a control electrode connected to the pull-up node, a first electrode connected to the clock signal terminal, and a second electrode connected to a cascade signal terminal;

one terminal of the storage capacitor is connected to the pull-up node, and the other terminal of the storage capacitor is connected to the signal output terminal;

a control electrode and a first electrode of the fifth transistor are both connected to a power voltage terminal, and a second electrode of the fifth transistors is connected to the pull-down node;

the sixth transistor has a control electrode connected to the pull-up node, a first electrode connected to a first reference level terminal, and a second electrode connected to the pull-down node;

the seventh transistor has a control electrode connected to the signal input terminal, a first electrode connected to the first reference level terminal, and a second electrode connected to the pull-down node;

control electrodes of the two eighth transistors are both connected to the pull-down node, a first one of the eighth transistors has a first electrode connected to the first reference level terminal, and a second electrode connected to a first electrode of a second one of the eighth transistors and the second electrode of the reverse bias control transistor, and a second electrode of the second one of the eighth transistors is connected to the pull-up node;

the thirteenth transistor has a control electrode connected to the pull-down node, a first electrode connected to a second reference level terminal, and a second electrode connected to the signal output terminal;

the twelfth transistor has a control electrode connected to the pull-down node, a first electrode connected to the first reference level terminal, and a second electrode connected to the cascade signal terminal;

control electrodes of the two second transistors are both connected to a reset signal terminal, a first one of the second transistors has a first electrode connected to the first reference level terminal, and a second electrode connected to a first electrode of a second one of the second transistors and the second electrode of the reverse bias control transistor, and a second electrode of the second one of the second transistors is connected to the pull-up node;

the fourth transistor has a control electrode connected to the reset signal terminal, a first electrode connected to the second reference level terminal, and a second electrode connected to the signal output terminal;

control electrodes of the two fifteenth transistors are both connected to a shift reset signal terminal, a first one of the fifteenth transistors has a first electrode connected to the first reference level terminal, and a second electrode connected to a first electrode of a second one of the fifteenth transistors and the second electrode of the reverse bias control transistor, and a second electrode of the second one of the fifteenth transistors is connected to the pull-up node; and a control electrode and a first electrode of the reverse bias control transistor are connected to the cascade signal terminal, and the second electrode of the reverse bias control transistor is connected to the second electrode of the first one of the first transistors, the second electrode of the first one of the eighth transistors, the second electrode of the first one of the second transistors, and the second electrode of the first one of the fifteenth transistors.

In a fourth aspect, an embodiment of the present disclosure provides a gate driving circuit, including a plurality of shift register units cascaded with each other, where each of the shift register units is the shift register unit described above.

In a fifth aspect, an embodiment of the present disclosure provides a display device, including the gate driving circuit described above.

In a sixth aspect, an embodiment of the present disclosure provides a method for driving a shift register unit, which is used to drive the shift register unit described above, where the method for driving the shift register unit includes:

when a potential of the pull-up node is at a third reference level, a power voltage signal or a cascade signal is written to the input sub-circuit and the first noise reduction sub-circuit by the reverse bias sub-circuit, so as to make transistors in the input sub-circuit and the first noise reduction sub-circuit be in a reverse bias state.

DETAIL DESCRIPTION OF EMBODIMENTS

Figure 1:
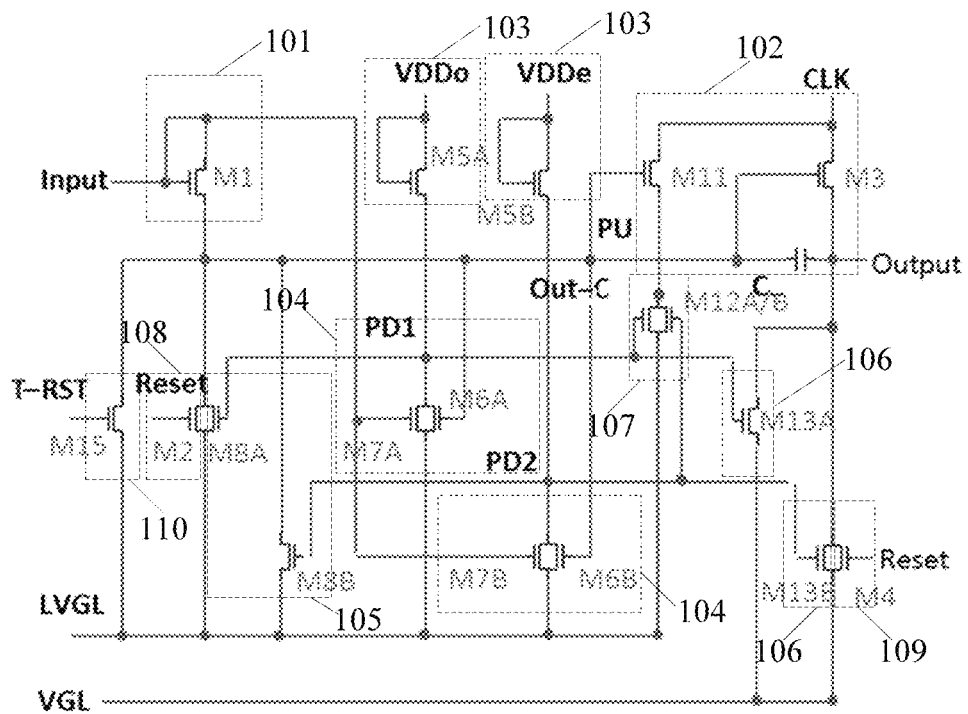
FIG. 1 is a schematic diagram of a circuit structure of an exemplary shift register unit.

In order to enable those skilled in the art to better understand the technical solutions of the present disclosure, the present disclosure is further described in detail below with reference to the drawings and specific implementations.

Unless otherwise defined, technical terms or scientific terms used herein should have general meanings that are understood by those of ordinary skill in the technical field of the present disclosure. The words "first", "second" and the like used herein do not denote any order, quantity or importance, but are just used to distinguish between different components. Similarly, the words "one", "a", "the" and the like do not denote a limitation to quantity, and indicate the existence of "at least one" instead. The words "include/including". "comprise/comprising" and the like indicate that an element or object before the words covers the elements or objects or the equivalents thereof listed after the words, rather than excluding other elements or objects. The words "connect/connecting". "couple/coupling" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

The transistors used in the embodiments of the present disclosure may be thin film transistors, field effect transistors, or other devices having the same characteristics. Since a source electrode and a drain electrode of each of the transistors used are symmetrical, there is no difference between the source electrode and the drain electrode in terms of function. In the embodiments of the present disclosure, in order to distinguish between the source electrode and the drain electrode of each transistor, one of the source electrode and the drain electrode is referred to as a first electrode, the other one of the source electrode and the drain electrode is referred to as a second electrode, and a gate electrode of each transistor is referred to as a control electrode. In addition, the transistors can be classified into N-type transistors and P-type transistors according to their characteristics. The N-type transistors are taken as an example in the following description of the embodiments. In a case where an N-type transistor is used, a first electrode is a source electrode of the N-type transistor, a second electrode is a drain electrode of the N-type transistor, and the source electrode and the drain electrode are electrically connected to each other when a high level is input to a gate electrode of the N-type transistor. The conditions of a P-type transistor are contrary to those of the N-type transistor. It can be readily envisaged by those skilled in the art without creative effort to use the P-type transistors to implement the embodiments of the present disclosure, and therefore, the use of the P-type transistors also falls within the scope of the embodiments of the present disclosure.

It should be noted that, in the embodiments of the present disclosure, a third reference level signal is a high-level signal, and both a first reference level signal and a second reference level signal are low-level signals; correspondingly, a power voltage terminal refers to a signal terminal VDD; a first reference level terminal refers to a first low-level terminal LVGL, and the first reference level signal refers to a first low-level signal; and a second reference level terminal refers to a second low-level terminal VGL, the second reference level signal refers to a second low-level signal, and a voltage of the first low-level signal is lower than that of the second low-level signal.

FIG. 1 is a schematic diagram of a circuit structure of an exemplary shift register unit. As shown in FIG. 1, the shift register unit includes: an input sub-circuit 101, an output sub-circuit 102, at least one pull-down control sub-circuit 103, at least one pull-down sub-circuit 104, at least one first noise reduction sub-circuit 105, at least one second noise reduction sub-circuit 106, at least one third noise reduction sub-circuit 107, a first reset sub-circuit 108, a second reset sub-circuit 109, and a shift reset sub-circuit 110. A pull-up node PU is at least simultaneously connected to the input sub-circuit 101, the output sub-circuit 102, the first noise reduction sub-circuit 105, the first reset sub-circuit 108, and the shift reset sub-circuit 110; and a pull-down node PD is at least simultaneously connected to the pull-down control sub-circuit 103, the pull-down sub-circuit 104, the first noise reduction sub-circuit 105, the second noise reduction sub-circuit 106, and the third noise reduction sub-circuit 107.

Specifically, the input sub-circuit 101 includes: a first transistor M1. The output sub-circuit 102 includes: a third transistor M3, an eleventh transistor M11, and a storage capacitor C. The pull-down control sub-circuit 103 includes: a fifth transistor M5. The pull-down sub-circuit 104 includes: a sixth transistor M6 and a seventh transistor M7. The first noise reduction sub-circuit 105 includes: an eighth transistor M8. The second noise reduction sub-circuit 106 includes: a thirteenth transistor M13. The third noise reduction sub-circuit 107 includes: a twelfth transistor M12. The first reset sub-circuit 108 includes: a second transistor M2. The second reset sub-circuit 109 includes: a fourth transistor M4. The shift reset sub-circuit 110 includes, a fifteenth transistor M15. A gate electrode and a source electrode of the first transistor M1 are both connected to a signal input terminal Input, and a drain electrode of the first transistor M1 is connected to the pull-up node PU. The third transistor M3 has a gate electrode connected to the pull-up node PU, a source electrode connected to a clock signal terminal CLK, and a drain electrode connected to a signal output terminal Output. The eleventh transistor M11 has a gate electrode connected to the pull-up node PU, a source electrode connected to the clock signal terminal CLK, and a drain electrode connected to a cascade signal terminal Out-C. One terminal of the storage capacitor C is connected to the pull-up node PU, and the other terminal of the storage capacitor C is connected to the signal output terminal Output. A gate electrode and a source electrode of a first fifth transistor M5A are both connected to a power voltage terminal VDD, and a drain electrode of the first fifth transistor M5A is connected to a first pull-down node PD1. A gate electrode and a source electrode of a fifth transistor M5B are both connected to the power voltage terminal VDD, and a drain electrode of the fifth transistor M5B is connected to a second pull-down node PD2. A first sixth transistor M6A has a gate electrode connected to the pull-up node PU, a source electrode connected to a first low-level terminal LVGL, and a drain electrode connected to the first pull-down node PD1. A second sixth transistor M6B has a gate electrode connected to the pull-up node PU, a source electrode connected to the first low-level terminal LVGL, and a drain electrode connected to the second pull-down node PD2. The seventh transistor M7 has a gate electrode connected to the signal input terminal Input, a source electrode connected to the first low-level terminal LVGL, and a drain electrode connected to the pull-down node PD. The eighth transistor M8 has a gate electrode connected to the pull-down node PD, a source electrode connected to the first low-level terminal LVGL, and a drain electrode connected to the pull-up node PU. The thirteenth transistor M13 has a gate electrode connected to the pull-down node PD, a source electrode connected to a second low-level terminal VGL, and a drain electrode connected to the signal output terminal Output. The twelfth transistor M12 has a gate electrode connected to the pull-down node PD, a source electrode connected to the first low-level terminal LVGL, and a drain electrode connected to the cascade signal terminal Out-C. The second transistor M2 has a gate electrode connected to a reset signal terminal Reset, a source electrode connected to the first low-level terminal LVGL, and a drain electrode connected to the pull-up node PU. The fourth transistor M4 has a gate electrode connected to the reset signal terminal Reset, a source electrode is connected to the second low-level terminal VGL, and a drain electrode connected to the signal output terminal Output. The fifteenth transistor M15 has a gate electrode connected to a shift reset signal terminal T-RST, a source electrode connected to the first low-level terminal LVGL, and a drain electrode connected to the pull-up node PU.

It should be noted that each of the shift register unit shown in FIG. 1 and shift register units provided by the following embodiments of the present disclosure may include at least one pull-down control sub-circuit 103, at least one pull-down sub-circuit 104, at least one first noise reduction sub-circuit 105, at least one second noise reduction sub-circuit 106, and at least one third noise reduction sub-circuit 107. The following description will be given by taking a case where two pull-down control sub-circuits 103, two pull-down sub-circuits 104, two first noise reduction sub-circuits 105, two second noise reduction sub-circuits 106, and two third noise reduction sub-circuits 107 are provided as an example. Any two sub-circuits having the same function have the same operation principle, for example, the two pull-down control sub-circuits 103 have the same operation principle, and can operate at different time, so that workloads of the transistors in the pull-down control sub-circuits 103 may be reduced, thereby increasing service lives of the transistors. Similarly, service lives of the transistors in the pull-down sub-circuits 104, the first noise reduction sub-circuits 105, the second noise reduction sub-circuits 106, and the third noise reduction sub-circuits 107 may be increased.

Correspondingly, the number of the pull-down nodes PD is two, i.e., PD1 and PD2; the number of the fifth transistors M5 is two, with the first fifth transistor M5 denoted by M5A and the second fifth transistor M5 denoted by M5B, and the power voltage terminals VDD respectively connected to the first fifth transistor M5A and second fifth transistor M5B are denoted by VDDo and VDDe, respectively; the number of the sixth transistors M6 is two, with the first sixth transistor M6 denoted by M6A and the second sixth transistor M6 denoted by M6B; the number of the seventh transistors M7 is two, with the first seventh transistor M7 denoted by M7A and the second seventh transistor M7 denoted by M7B; the number of the eighth transistors M8 is two, with the first eighth transistor M8 denoted by M8A and the second eighth transistor M8 denoted by M8B; the number of the thirteenth transistors M13 is two, with the first thirteenth transistor M13 denoted by M13A and the second thirteenth transistor M13 denoted by M13B; and the number of the twelfth transistors M12 is two, with the first twelfth transistor M12 denoted by M12A and the second twelfth transistor M12 denoted by M12B.

A specific operation process of the shift register unit shown in FIG. 1 may include a pre-charging stage, a reset stage, a reset stage, a noise reduction stage and an end stage.

In the pre-charging stage, a high-level signal is input to the signal input terminal Input, the first transistor M1 is turned on, at this time, the high-level signal input to the signal input terminal Input pulls up a potential of the pull-up node PU, and the potential of the pull-up node PU is stored by the storage capacitor C.

In the output stage, a low-level signal is input to the signal input terminal Input, and the first transistor M1 is turned off. At this time, since the storage capacitor C is charged in the pre-charging stage, the potential of the pull-up node PU is further pulled up; since the gate electrodes of the third transistor M3 and the eleventh transistor M11 are both connected to the pull-up node PU, the third transistor M3 and the eleventh transistor M11 are turned on, the output signal terminal Output outputs a clock signal of the clock signal terminal CLK as an output signal, and the cascade signal terminal Out-C outputs the clock signal as a cascade signal. At this time, the clock signal is a high-level signal, and the output signal is also a high-level signal.

In the reset stage, a low-level signal is input to the signal input terminal Input, and the first transistor M1 is turned off. At this time, a high-level signal is input to the reset signal terminal Reset, the second transistor M2 and the fourth transistor M4 are turned on, a first low-level signal at the first low-level terminal LVGL is written to the pull-up node PU, a second low-level signal at the second low-level terminal VGL is written to the signal output terminal Output, and the potential of the pull-up node PU and a potential of the signal output terminal Output are reset.

In the noise reduction stage, a low-level signal is input to the signal input terminal Input, and the first transistor M1 is turned off. A low-level signal is input to the reset signal terminal Reset, and the second transistor M2 and the fourth transistor M4 are turned off. At this time, the potential of the pull-up node PU is maintained the same as in the reset stage and is a first low-level potential, and the potential of the signal output terminal Output is maintained the same as in the reset stage and is a second low-level potential. At this time, the pull-down nodes PD (the first pull-down node PD1 and the second pull-down node PD2) both are at a high-level potential, the eighth transistors M8, the thirteenth transistors M13, and the twelfth transistors M12 are turned on, and noise reduction is continuously performed on the pull-up node PU, the signal output terminal Output, and the cascade signal terminal Out-C.

In the end stage, a high-level signal is input to the shift reset signal terminal T-RST, the fifteenth transistor M15 is turned on, the first low-level signal of the first low-level terminal LVGL is written to the pull-up node, and the potential of the pull-up node PU is reset.

When the oxide thin film transistors with higher mobility are used in a large-sized high-resolution display, threshold voltages (Vth) of the thin film transistors are not stable; and the higher the mobility, the more easily the negative bias fluctuation of the threshold voltages of the thin film transistors occurs, resulting in difficulty in maintaining a voltage of the pull-up node PU. For example, electrical leakage of the pull-up node PU through the eighth transistors M8 is caused when negative bias fluctuation of the threshold voltages occurs in the eighth transistors M8, and the electrical leakage makes the signal output by the signal output terminal Output unstable, which affects operating performance of a circuit of the shift register unit, resulting in a problem of poor display of a display panel driven by the shift register unit.

In order to solve at least one of the above technical problems, the embodiments of the present disclosure provide a shift register unit, a gate driving circuit and a display device, which will be further described in detail below.

Figure 2:
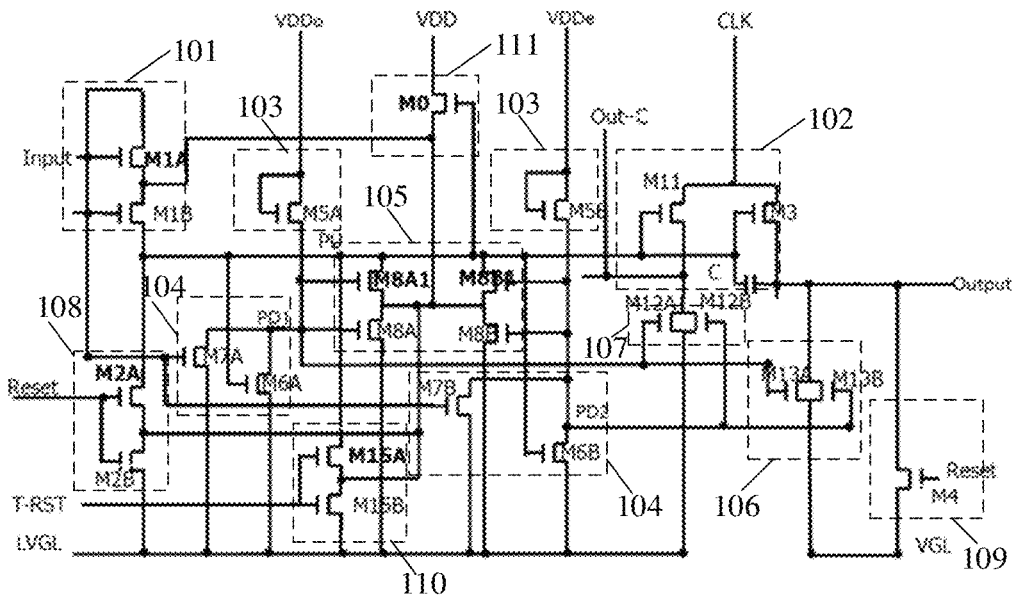
FIG. 2 is a schematic diagram of a circuit structure of a shift register unit according to an embodiment of the present disclosure.
Figure 3:
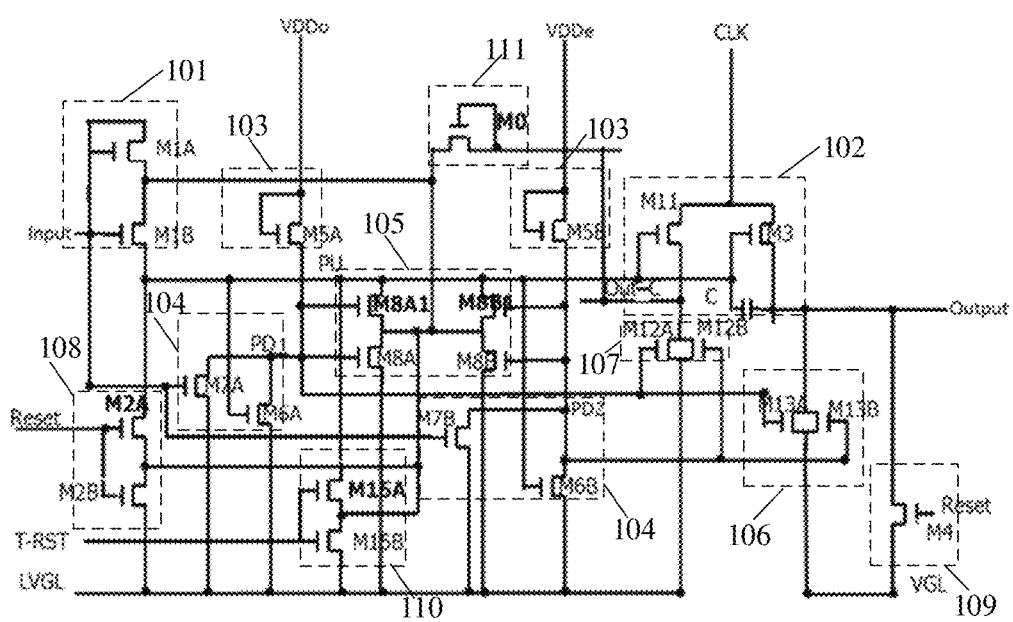
FIG. 3 is a schematic diagram of a circuit structure of another shift register unit according to an embodiment of the present disclosure.

The embodiments of the present disclosure provide a shift register unit, FIG. 2 is a schematic diagram of a circuit structure of a shift register unit according to an embodiment of the present disclosure, and FIG. 3 is a schematic diagram of a circuit structure of another shift register unit according to an embodiment of the present disclosure. As shown in FIG. 2 and FIG. 3, the shift register unit provided by the embodiments of the present disclosure includes, an input sub-circuit 101, an output sub-circuit 102, at least one pull-down control sub-circuit 103, at least one pull-down sub-circuit 104, at least one first noise reduction sub-circuit 105, and a reverse bias sub-circuit 111. The input sub-circuit 101 is configured to pull up a potential of a pull-up node PU through an input signal from a signal input terminal Input in response to the input signal; and the pull-up node PU is at least simultaneously connected to the input sub-circuit 101, the output sub-circuit 102, and the first noise reduction sub-circuit 105. The output sub-circuit 102 is configured to output a signal through a signal output terminal Output and output a signal through a cascade signal terminal Out-C in response to the potential of the pull-up node PU which is already pulled up. The pull-down control sub-circuit 103 is configured to control a potential of a pull-down node PD with a power voltage signal in response to the power voltage signal; and the pull-down node PD is at least simultaneously connected to the pull-down control sub-circuit 103, the pull-down sub-circuit 104, and the first noise reduction sub-circuit 105. The pull-down sub-circuit 104 is configured to pull down the potential of the pull-down node PD through a first low-level signal in response to the potential of the pull-up node PU and a potential of the signal input terminal Input. The first noise reduction sub-circuit 105 is configured to perform noise reduction on the potential of the pull-up node PU through the first low-level signal in response to the potential of the pull-down node PD. The reverse bias sub-circuit 111 is configured to control transistors in at least part of sub-circuits connected to the pull-up node PU to be in a reverse bias state through the power voltage signal in response to the potential of the pull-up node PU, or, control the transistors in at least part of the sub-circuits connected to the pull-up node PU to be in the reverse bias state through a cascade signal in response to a potential of the cascade signal terminal Out-C.

In the shift register unit provided by the embodiments of the present disclosure, as the reverse bias sub-circuit 111 is added to the shift register unit, the reverse bias sub-circuit 111 can control the transistors in the sub-circuits connected to the pull-up node PU to be in the reverse bias state, for example, when the potential of the pull-up node PU is a high-level potential, the reverse bias sub-circuit 111 can input the power voltage signal or the cascade signal to the input sub-circuit 101 to control a transistor in the input sub-circuit 101 to be in the reverse bias state, so that the input signal of the input signal terminal Input can be effectively input to the pull-up node PU, thereby ensuring that the potential of the pull-up node PU can be stably maintained. Meanwhile, the reverse bias sub-circuit 111 may input the power voltage signal or the cascade signal to the first noise reduction sub-circuit 105 to control a transistor in the first noise reduction sub-circuit 105 to be in the reverse bias state, so as to prevent electrical leakage from occurring in the pull-up node PU. It can be seen that, in the shift register unit provided by the embodiments of the present disclosure, it can be ensured that the potential of the pull-up node PU reaches a preset potential due to cooperation between each of the sub-circuits (the input sub-circuit 101, the first noise reduction sub-circuit 105, etc.) connected to the pull-up node PU and the reverse bias sub-circuit 111, and negative bias fluctuation is prevented from occurring in a threshold voltage of each transistor in each of the sub-circuits so as to avoid affecting the potential of the pull-up node PU, so that it can be ensured that the output signal of the signal output terminal Output is stable, thereby further ensuring a good display effect of a driven display panel.

In some embodiments, as shown in FIG. 2, the reverse bias sub-circuit 111 includes: a reverse bias control transistor M0, which has a gate electrode connected to the pull-up node PU, a source electrode connected to a power voltage terminal VDD, and a drain electrode connected to the input sub-circuit 101 and the first noise reduction sub-circuit 105.

When the potential of the pull-up node PU is a high-level potential, the reverse bias control transistor M0 is turned on, and the power voltage signal is input to the input sub-circuit 101 to control the transistor in the input sub-circuit 101 to be in the reverse bias state, so that the input signal of the input signal terminal Input may be effectively input to the pull-up node PU, thereby ensuring that the potential of the pull-up node PU may be stably maintained. Meanwhile, the power voltage signal is input to the first noise reduction sub-circuit 105 to control the transistor in the first noise reduction sub-circuit 105 to be in the reverse bias state, thereby preventing the electrical leakage from occurring in the pull-up node PU.

In some implementations, as shown in FIG. 3, the reverse bias sub-circuit 111 includes the reverse bias control transistor M0; and the gate electrode and the source electrode of the reverse bias control transistor M0 are both connected to the cascade signal terminal Out-C, and the drain electrode of the reverse bias control transistor M0 is connected to the input sub-circuit 101 and the first noise reduction sub-circuit 105.

When the potential of the pull-up node PU is a high-level potential, the reverse bias control transistor M0 is turned on, at this time, the cascade signal is a high-level signal and is input to the input sub-circuit 101 to control the transistor in the input sub-circuit 101 to be in the reverse bias state, so that the input signal of the input signal terminal Input may be effectively input to the pull-up node PU, thereby ensuring that the potential of the pull-up node PU may be stably maintained. Meanwhile, the cascade signal is input to the first noise reduction sub-circuit 105 to control the transistor in the first noise reduction sub-circuit 105 to be in the reverse bias state, thereby preventing the electrical leakage from occurring in the pull-up node PU. The shift register unit shown in FIG. 3 differs from the shift register unit shown in FIG. 2 in that the source electrode of the reverse bias control transistor M0 in the shift register unit shown in FIG. 3 is connected to the cascade signal terminal Out-C, so that the reverse bias control transistor M0 does not need to be separately connected to the power voltage terminal VDD, which may save power consumption of the shift register unit.

In some implementations, as shown in FIG. 2 and FIG. 3, the input sub-circuit 101 includes: at least two first transistors M1 (which are denoted by MlA and MlB, respectively); gate electrodes of the two first transistors MlA and MlB are both connected to the signal input terminal Input, a source electrode of the first first transistor MlA is connected to the signal input terminal Input, a drain electrode of the first first transistor MlA is connected to a source electrode of the second first transistor MlB and the reverse bias sub-circuit 111, and a drain electrode of the second first transistor MlB is connected to the pull-up node PU.

In an input stage, a high-level signal is written to the signal input terminal Input, the first transistors MlA and MlB are turned on, and the pull-up node may be pre-charged through the high-level signal written to the signal input terminal Input. In the embodiments of the present disclosure, by adopting the two first transistors MlA and MlB, the two first transistors MlA and MlB may operate simultaneously, which may alleviate shifting of threshold voltages of the two first transistors MlA and MlB; meanwhile, with the cooperation of the reverse bias sub-circuit 111, the input signal of the input signal terminal Input may be effectively input to the pull-up node PU, thereby ensuring that the potential of the pull-up node PU may be stably maintained.

In some implementations, as shown in FIG. 2 and FIG. 3, one first noise reduction sub-circuit 105 includes: at least two eighth transistors M8 (which are denoted by M8A1 and M8A, respectively); gate electrodes of the two eighth transistors M8A1 and M8A are both connected to a pull-down node PD, that is, the gate electrode of the first eighth transistor M8A1 is connected to a first pull-down node PD1 and the gate electrode of the second eighth transistor M8A is connected to a second pull-down node PD2, a source electrode of the first eighth transistor M8A1 is connected to a first low-level terminal LVGL, a drain electrode of the first eighth transistor M8A1 is connected to a source electrode of the second eighth transistor M8A and the reverse bias sub-circuit 111, and a drain electrode of the second eighth transistor M8A is connected to the pull-up node PU. The other first noise reduction sub-circuit 105 is configured in the same way, with the two eighth transistors M8 therein denoted by M8B1 and M8B respectively, and a connection way of the two eighth transistors M8B1 and M8B is the same as that of the two eighth transistors M8A1 and M8A, and thus will not be repeated here.

In a noise reduction stage, taking one of the first noise reduction sub-circuits 105 as an example, when the first pull-down node PD1 is at a high-level potential, the eighth transistors M8A1 and M8A are both turned on, at this time, noise reduction may be performed on the pull-up node PU through the first low-level signal. In the embodiments of the present disclosure, by adopting the two eighth transistors M8A1 and M8A, the two eighth transistors M8A1 and M5A may operate simultaneously, which may alleviate shifting of threshold voltages of the two eighth transistors M8A1 and M8A; meanwhile, with the cooperation of the reverse bias sub-circuit 111, the eighth transistors M8A1 and M8A may be prevented from being turned on incompletely, so as to prevent the electrical leakage from occurring in the pull-up node PU. An implementation principle of the other first noise reduction sub-circuit 105 is similar to that described above, and thus will not be repeated here.

In some implementations, as shown in FIG. 2 and FIG. 3, the shift register unit further includes: a first reset sub-circuit 108 configured to reset the potential of the pull-up node PU through the first low-level signal in response to a reset signal. Specifically, the first reset sub-circuit 108 includes: at least two second transistors M2 (which are denoted by M2A and M2B, respectively); gate electrodes of the two second transistors M2A and M2B are both connected to a reset signal terminal Reset, a source electrode of the first second transistor M2A is connected to the first low-level terminal LVGL, a drain electrode of the first second transistor M2A is connected to a source electrode of the second second transistor M2B and the reverse bias sub-circuit 111, and a drain electrode of the second second transistor M2B is connected to the pull-up node PU.

In a reset stage, a high-level signal is input to the reset signal terminal Reset, the second transistors M2A and M2B are turned on, at this time, the potential of the pull-up node PU may be reset through a second low-level signal. In the embodiments of the present disclosure, by adopting the two second transistors M2A and M2B, the two second transistors M2A and M2B may operate simultaneously, which may alleviate shifting of threshold voltages of the two second transistors M2A and M2B; meanwhile, with the cooperation of the reverse bias sub-circuit 111, the second transistors M2A and M2B may be prevented from being turned on incompletely, so as to prevent the electrical leakage from occurring in the pull-up node PU.

In some implementations, as shown in FIG. 2 and FIG. 3, the shift register unit further includes: a shift reset sub-circuit 110 configured to reset the potential of the pull-up node PU through the first low-level signal in response to a shift reset signal. Specifically, the shift reset sub-circuit 110 includes: at least two fifteenth transistors M15 (which are denoted by M15A and M15B, respectively); gate electrodes of the two fifteenth transistors M15A and M15B are both connected to a shift reset signal terminal T-RST, a source electrode of the first fifteenth transistor M15A is connected to the first low-level terminal LVGL, a drain electrode of the first fifteenth transistor M15A is connected to a source electrode of the second fifteenth transistor M15B and the reverse bias sub-circuit 111, and a drain electrode of the second fifteenth transistor M15B is connected to the pull-up node PU.

In an end stage, a high-level signal is written to the shift reset signal terminal T-RST, the fifteenth transistors M15A and M15B are turned on, and the first level signal of the first low-level terminal LVGL is written to the pull-up node PU to reset the potential of the pull-up node PU. In the embodiments of the present disclosure, by adopting the two fifteenth transistors M15A and M15B, the two fifteenth transistors M15A and M15B may operate simultaneously, which may alleviate shifting of threshold voltages of the two fifteenth transistors M15A and M15B; meanwhile, with the cooperation of the reverse bias sub-circuit 111, the fifteenth transistors M15A and M15B may be prevented from being turned on incompletely, so as to prevent the electrical leakage from occurring in the pull-up node PU.

In some implementations, as shown in FIG. 2 and FIG. 3, the shift register unit further includes: a second reset sub-circuit 109 configured to reset a potential of the signal output terminal Output through a second low-level signal in response to the reset signal. Specifically, the second reset sub-circuit 109 includes: a fourth transistor M4, which has a gate electrode connected to the reset signal terminal Reset, a source electrode connected to the second low-level terminal VGL, and a drain electrode connected to the signal output terminal Output.

In the reset stage, a high-level signal is input to the reset signal terminal Reset, the fourth transistor M4 is turned on, at this time, the potential of the signal output terminal Output may be reset through the second low-level signal.

In some implementations, as shown in FIG. 2 and FIG. 3, the shift register unit further includes: at least one second noise reduction sub-circuit 106 configured to perform noise reduction on the potential of the signal output terminal Output through the second low-level signal in response to the potential of the pull-down node PD. Specifically, one second noise reduction sub-circuit 106 includes: a thirteenth transistor M13A, which has a gate electrode connected to the first pull-down node PD1, a source electrode connected to the second low-level terminal VGL, and a drain electrode connected to the signal output terminal Output. Another second noise reduction sub-circuit 106 includes: a thirteenth transistor M13B, and a connection way of the thirteenth transistor M13B is the same as that of the thirteenth transistor M13A described above, and thus will not be repeated here.

In the noise reduction stage, when the first pull-down node PD1 is at a high-level potential, the thirteenth transistor M13A is turned on, at this time, noise reduction may be performed on the signal output terminal Output through the second low-level signal. When the second pull-down node PD2 is at a high-level potential, the thirteenth transistor M13B is turned on, at this time, noise reduction may be performed on the signal output terminal Output through the second low-level signal. The two thirteenth transistors M13A and M13B are turned on at different time, so as to prolong service lives of the thirteenth transistors M13A and M13B.

In some implementations, as shown in FIG. 2 and FIG. 3, the shift register unit further includes: at least one third noise reduction sub-circuit 107 configured to perform noise reduction on the potential of the cascade signal terminal Out-C through the first low-level signal in response to the potential of the pull-down node PD. Specifically, one third noise reduction sub-circuit 107 includes: a first twelfth transistor M12A, which has a gate electrode connected to the first pull-down node PD1, a source electrode connected to the first low-level terminal, and a drain electrode connected to the cascade signal terminal Out-C. Another third noise reduction sub-circuit 107 includes: a second twelfth transistor M12B; and a connection way of the twelfth transistor M12B is the same as that of the first twelfth transistor M12A described above, and thus will not be repeated here.

In the noise reduction stage, when the first pull-down node PD1 is at a high-level potential, the first twelfth transistor M12A is turned on, at this time, noise reduction may be performed on the cascade signal terminal Out-C through the first low-level signal. When the second pull-down node PD2 is at a high-level potential, the second twelfth transistor M12B is turned on, at this time, noise reduction may be performed on the cascade signal terminal Out-C through the first low-level signal. The two twelfth transistors M12A and M12B are turned on at different time, so as to prolong service lives of the twelfth transistors M12A and M12B.

In some implementations, as shown in FIG. 2 and FIG. 3, the output sub-circuit 102 includes: a third transistor M3, an eleventh transistor M11, and a storage capacitor C; the third transistor M3 has a gate electrode connected to the pull-up node PU, a source electrode connected to a clock signal terminal CLK, and a drain electrode connected to the signal output terminal Output; the eleventh transistor M11 has a gate electrode connected to the pull-up node PU, a source electrode connected to the clock signal terminal CLK, and a drain electrode connected to the cascade signal terminal Out-C; and one terminal of the storage capacitor C is connected to the pull-up node PU, and the other terminal of the storage capacitor C is connected to the signal output terminal Output.

In an output stage, a low-level signal is input to the signal input terminal Input, and the first transistor M1 is turned off. At this time, since the storage capacitor C is pre-charged in a pre-charging stage, the potential of the pull-up node PU is further pulled up; since the gate electrodes of the third transistor M3 and the eleventh transistor M11 are both connected to the pull-up node PU, the third transistor M3 and the eleventh transistor M11 are turned on, the output signal terminal Output outputs a clock signal of the clock signal terminal CLK as an output signal, and the cascade signal terminal Out-C outputs the clock signal as a cascade signal. At this time, the clock signal is a high-level signal, and the output signal is also a high-level signal.

In some implementations, as shown in FIG. 2 and FIG. 3, one pull-down control sub-circuit 103 includes: a first fifth transistor M5A; a gate electrode and a source electrode of the fifth transistor M5A are both connected to a power voltage terminal VDDo, and a drain electrode of the fifth transistor M5A is connected to the first pull-down node PD1. Another pull-down control sub-circuit 103 includes, a second fifth transistor M5B; and a connection way of the second fifth transistor M5B is the same as that of the first fifth transistor M5A described above, and thus will not be repeated here.

The gate electrode and the source electrode of the first fifth transistor M5A are connected to the power voltage terminal VDDo, that is, the first fifth transistor M5A is turned on when the power voltage signal is written to the gate electrode and the source electrode of the first fifth transistor M5A, and a potential of the first pull-down node PD1 is a potential of a power voltage of the power voltage terminal VDDo, that is, the potential of the first pull-down node PD1 is a high-level potential. The gate electrode and the source electrode of the second fifth transistor M5B are connected to a power voltage terminal VDDe, that is, the second fifth transistor M5B is turned on when a power voltage signal is written to the gate electrode and the source electrode of the second fifth transistor M5B, and a potential of the second pull-down node PD2 is a potential of a power voltage of the power voltage terminal VDDe, that is, the potential of the second pull-down node PD2 is a high-level potential.

In some implementations, as shown in FIG. 2 and FIG. 3, one pull-down sub-circuit 104 includes: a first sixth transistor M6A and a first seventh transistor M7A; the first sixth transistor M6A has a gate electrode connected to the pull-up node PU, a source electrode connected to the first low-level terminal LVGL, and a drain electrode connected to the first pull-down node PD1; and the first seventh transistor M7A has a gate electrode connected to the signal input terminal Input, a source electrode connected to the first low-level terminal LVGL, and a drain electrode connected to the first pull-down node PD1. Another pull-down sub-circuit 104 includes: a second sixth transistor M6B and a second seventh transistor M7B; and a connection way of the second sixth transistor M6B and the second seventh transistor M7B is the same as that of the first sixth transistor M6A and the first seventh transistor M7A, and thus will not be repeated here.

When a high-level signal is written to the signal input terminal Input, the first seventh transistor M7A is turned on, the first low-level signal is written to the first pull-down node PD1, and meanwhile, a high-level signal is written to the pull-up node PU, the first sixth transistor M6A is turned on, and the first low-level signal may be continuously written to the first pull-down node PD1, so that it may be ensured that the potential of the first pull-down node PD1 is continuously pulled down. Similarly, the second sixth transistor M6B and the second seventh transistor M7B may ensure that the potential of the second pull-down node PD2 is continuously pulled down.

An embodiment of the present disclosure further provides a shift register unit, as shown in FIG. 2, including: an input sub-circuit 101, an output sub-circuit 102, at least one pull-down control sub-circuit 103, at least one pull-down sub-circuit 104, at least one first noise reduction sub-circuit 105, at least one second noise reduction sub-circuit 106, at least one third noise reduction sub-circuit 107, a first reset sub-circuit 108, a second reset sub-circuit 109, a shift reset sub-circuit 110, and a reverse bias sub-circuit 111; a pull-up node PU is at least simultaneously connected to the input sub-circuit 101, the output sub-circuit 102, and the first noise reduction sub-circuit 105; and a pull-down node PD is at least simultaneously connected to the pull-down control sub-circuit 103, the pull-down sub-circuit 104, and the first noise reduction sub-circuit 105.

The input sub-circuit 101 includes: at least two first transistors M1A and M1B; the output sub-circuit 102 includes: a third transistor M3, an eleventh transistor M11, and a storage capacitor C; the pull-down control sub-circuit 103 includes: fifth transistors M5A and M5B; the pull-down sub-circuit 104 includes: sixth transistors M6A and M6B, and seventh transistors M7A and M7B; the first noise reduction sub-circuit 105 includes: at least two eighth transistors M8A1, M8A, M8B1, and M8B; the second noise reduction sub-circuit 106 includes: thirteenth transistors M13A and M13B; the third noise reduction sub-circuit 107 includes: twelfth transistors M12A and M12B; the first reset sub-circuit 108 includes: at least two second transistors M2A and M2B; the second reset sub-circuit 109 includes: a fourth transistor M4; the shift reset sub-circuit 110 includes: at least two fifteenth transistors M15A and M15B; and the reverse bias sub-circuit 111 includes: a reverse bias control transistor M0. The reverse bias control transistor M0 has a gate electrode connected to the pull-up node PU, a source electrode connected to a power voltage terminal VDD, and a drain electrode connected to a drain electrode of a first first transistor M1A, a drain electrode of a first eighth transistor M8A, a drain electrode of a first second transistor M2A, and a drain electrode of a first fifteenth transistor M15A. A connection way and an implementation principle of each of the other transistors are similar to those of the reverse bias control transistor M0 described above, and thus will not be repeated here.

An embodiment of the present disclosure further provides another shift register unit, as shown in FIG. 3, including: an input sub-circuit 101, an output sub-circuit 102, at least one pull-down control sub-circuit 103, at least one pull-down sub-circuit 104, at least one first noise reduction sub-circuit 105, at least one second noise reduction sub-circuit 106, at least one third noise reduction sub-circuit 107, a first reset sub-circuit 108, a second reset sub-circuit 109, a shift reset sub-circuit 110, and a reverse bias sub-circuit 111; a pull-up node PU is at least simultaneously connected to the input sub-circuit 101, the output sub-circuit 102, and the first noise reduction sub-circuit 105; and a pull-down node PD is at least simultaneously connected to the pull-down control sub-circuit 103, the pull-down sub-circuit 104, and the first noise reduction sub-circuit 105.

The input sub-circuit 101 includes: at least two first transistors M1A and M1B; the output sub-circuit 102 includes: a third transistor M3, an eleventh transistor M11, and a storage capacitor C; the pull-down control sub-circuit 103 includes: fifth transistors M5A and M5B; the pull-down sub-circuit 104 includes: sixth transistors M6A and M6B, and seventh transistors M7A and M7B; the first noise reduction sub-circuit 105 includes: at least two eighth transistors M5A1, M8A, M8B1, and M8B; the second noise reduction sub-circuit 106 includes: thirteenth transistors M13A and M13B; the third noise reduction sub-circuit 107 includes: twelfth transistors M12A and M12B; the first reset sub-circuit 108 includes: at least two second transistors M2A and M2B; the second reset sub-circuit 109 includes: a fourth transistor M4; the shift reset sub-circuit 110 includes: at least two fifteenth transistors M15A and M15B; and the reverse bias sub-circuit 111 includes: a reverse bias control transistor M0. A gate electrode and a source electrode of the reverse bias control transistor M0 are connected to a cascade signal terminal Out-C, and a drain electrode of the reverse bias control transistor M0 is connected to a drain electrode of a first first transistor MIA, a drain electrode of a first eighth transistor M8A, a drain electrode of a first second transistor M2A, and a drain electrode of a first fifteenth transistor MISA. A connection way and an implementation principle of each of the other transistors are similar to those of the reverse bias control transistor M0 described above, and thus will not be repeated here.

The shift register unit shown in FIG. 3 differs from the shift register unit shown in FIG. 2 in that the source electrode of the reverse bias control transistor M0 in the shift register unit shown in FIG. 3 is connected to the cascade signal terminal Out-C, so that the reverse bias control transistor M0 does not need to be separately connected to the power voltage terminal VDD, which may save power consumption of the shift register unit.

An embodiment of the present disclosure further provides a gate driving circuit, including a plurality of shift register units cascaded with each other, and each of the shift register units adopts the shift register unit provided by any one of the above embodiments.

The gate driving circuit provided by the embodiment of the present disclosure may output scanning signals stage by stage to drive a display panel to perform progressive scanning, thereby performing a display function. In each of the shift register units of the gate driving circuit, with the reverse bias sub-circuit 111 added to the shift register unit, the reverse bias sub-circuit 111 may control the transistors in the sub-circuits connected to the pull-up node PU to be in the reverse bias state, and each of the sub-circuits connected to the pull-up node PU adopts a dual-transistor structure, for example, when the potential of the pull-up node PU is a high-level potential, the reverse bias sub-circuit 111 may input the power voltage signal or the cascade signal to the input sub-circuit 101 to control the transistors in the input sub-circuit 101 adopting the dual-transistor structure to be in the reverse bias state, so that the input signal of the input signal terminal Input can be effectively input to the pull-up node PU, thereby ensuring that the potential of the pull-up node PU can be stably maintained. Meanwhile, the reverse bias sub-circuit 111 may input the power voltage signal or the cascade signal to the first noise reduction sub-circuit 105 to control the transistors in the first noise reduction sub-circuit 105 adopting the dual-transistor structure to be in the reverse bias state, so that the electrical leakage can be prevented from occurring in the pull-up node PU. It can be seen that, in the shift register unit provided by the embodiments of the present disclosure, it can be ensured that the potential of the pull-up node PU reaches the preset potential due to the cooperation between each of the sub-circuits (e.g., the input sub-circuit 101 and the first noise reduction sub-circuit 105) connected to the pull-up node PU and the reverse bias sub-circuit 111, and the negative bias fluctuation can be prevented from occurring in the threshold voltage of the transistor in each of the sub-circuits and thus avoiding affacting the potential of the pull-up node PU, so that it can be ensured that the output signal of the signal output terminal Output is stable, thereby further ensuring a good display effect of the driven display panel.

An embodiment of the present disclosure further provides a display device, including the gate driving circuit provided by any one of the above embodiments. The display device may be any display device such as a large-sized television, a display, or a vehicle navigation device. An implementation principle and technical effects of the display device are the same as those of the gate driving circuit provided by any one of the above embodiments, and thus will not be repeated here.

An embodiment of the present disclosure further provides a method for driving a shift register unit, which is used to drive the shift register unit provided by any one of the above embodiments. The method for driving a shift register unit includes: when the potential of the pull-up node is a high-level potential, a power voltage signal or a cascade signal is written to the input sub-circuit and the first noise reduction sub-circuit by the reverse bias sub-circuit, so as to make transistors in the input sub-circuit and the first noise reduction sub-circuit be in a reverse bias state.

In the method for driving the shift register unit provided by the embodiments of the present disclosure, the power voltage signal or the cascade signal may be written to the input sub-circuit or the first noise reduction sub-circuit, so as to make the transistors in the input sub-circuit and the first noise reduction sub-circuit be in the reverse bias state, so that it can be ensured that the potential of the pull-up node PU reaches the preset potential, and the negative bias fluctuation can be prevented from occurring in the threshold voltage of the transistor in each of the sub-circuits, and thus avoiding affacting the potential of the pull-up node PU, so that it can be ensured that the output signal of the signal output terminal Output is stable, thereby further ensuring a good display effect of a driven display panel.

It should be understood that the above implementations are merely exemplary implementations adopted to illustrate the principle of the present disclosure, and the present disclosure is not limited thereto. Various modifications and improvements can be made by those of ordinary sill in the art without departing from the spirit and essence of the present disclosure, and these modifications and improvements are also considered to fall within the scope of the present disclosure.

What is claimed is:

1. A shift register unit, comprising: an input sub-circuit, an output sub-circuit, at least one pull-down control sub-circuit, at least one pull-down sub-circuit, at least one first noise reduction sub-circuit, at least one second noise reduction sub-circuit, at least one third noise reduction sub-circuit, a first reset sub-circuit, a second reset sub-circuit, a shift reset sub-circuit, and a reverse bias sub-circuit; a pull-up node is at least simultaneously connected to the input sub-circuit, the output sub-circuit, and the first noise reduction sub-circuit; and a pull-down node is at least simultaneously connected to the pull-down control sub-circuit, the pull-down sub-circuit, and the first noise reduction sub-circuit; and the input sub-circuit comprises: at least two first transistors; the output sub-circuit comprises: a third transistor, an eleventh transistor, and a storage capacitor; the pull-down control sub-circuit comprises: a fifth transistor; the pull-down sub-circuit comprises: a sixth transistor and a seventh transistor; the first noise reduction sub-circuit comprises: at least two eighth transistors; the second noise reduction sub-circuit comprises: a thirteenth transistor; the third noise reduction sub-circuit comprises: a twelfth transistor; the first reset sub-circuit comprises: at least two second transistors;

the second reset sub-circuit comprises: a fourth transistor; the shift reset sub-circuit comprises: at least two fifteenth transistors; and the reverse bias sub-circuit comprises: a reverse bias control transistor;

control electrodes of the two first transistors are both connected to a signal input terminal, a first one of the first transistors has a first electrode connected to the signal input terminal, and a second electrode connected to a first electrode of a second one of the first transistors and a second electrode of the reverse bias control transistor, and a second electrode of the second one of the first transistors is connected to the pull-up node;

the third transistor has a control electrode connected to the pull-up node, a first electrode connected to a clock signal terminal, and a second electrode connected to a signal output terminal;

the eleventh transistor has a control electrode connected to the pull-up node, a first electrode connected to the clock signal terminal, and a second electrode connected to a cascade signal terminal;

one terminal of the storage capacitor is connected to the pull-up node, and the other terminal of the storage capacitor is connected to the signal output terminal;

a control electrode and a first electrode of the fifth transistor are both connected to a power voltage terminal, and a second electrode of the fifth transistor is connected to the pull-down node;

the sixth transistor has a control electrode connected to the pull-up node, a first electrode connected to a first reference level terminal, and a second electrode connected to the pull-down node;

the seventh transistor has a control electrode connected to the signal input terminal, a first electrode connected to the first reference level terminal, and a second electrode connected to the pull-down node;

control electrodes of the two eighth transistors are both connected to the pull-down node, a first one of the eighth transistors has a first electrode connected to the first reference level terminal, and a second electrode connected to a first electrode of a second one of the eighth transistors and the second electrode of the reverse bias control transistor, and a second electrode of the second one of the eighth transistors is connected to the pull-up node;

the thirteenth transistor has a control electrode connected to the pull-down node, a first electrode connected to a second reference level terminal, and a second electrode connected to the signal output terminal;

the twelfth transistor has a control electrode connected to the pull-down node, a first electrode connected to the first reference level terminal, and a second electrode connected to the cascade signal terminal;

control electrodes of the two second transistors are both connected to a reset signal terminal, a first one of the second transistors has a first electrode connected to the first reference level terminal, and a second electrode connected to a first electrode of a second one of the second transistors and the reverse bias sub-circuit, and a second electrode of the second one of the second transistors is connected to the pull-up node;

the fourth transistor has a control electrode connected to the reset signal terminal, a first electrode connected to the second reference level terminal, and a second electrode connected to the signal output terminal;

control electrodes of the two fifteenth transistors are both connected to a shift reset signal terminal, a first one of the fifteenth transistors has a first electrode connected to the first reference level terminal, and a second electrode connected to a first electrode of a second one of the fifteenth transistors and the second electrode of the reverse bias control transistor, and a second electrode of the second one of the fifteenth transistors is connected to the pull-up node; and a control electrode of the reverse bias control transistor is connected to the pull-up node, a first electrode of the reverse bias control transistor is connected to the power voltage terminal, and the second electrode of the reverse bias control transistor is connected to the second electrode of the first one of the first transistors, the second electrode of the first one of the eighth transistors, the second electrode of the first one of the second transistors, and the second electrode of the first one of the fifteenth transistors.

2. A gate driving circuit, comprising a plurality of shift register units cascaded with each other, wherein each of the shift register units is the shift register unit of claim 1.

3. A display device, comprising the gate driving circuit of claim 2.

4. A shift register unit, comprising: an input sub-circuit, an output sub-circuit, at least one pull-down control sub-circuit, at least one pull-down sub-circuit, at least one first noise reduction sub-circuit, at least one second noise reduction sub-circuit, at least one third noise reduction sub-circuit, a first reset sub-circuit, a second reset sub-circuit, a shift reset sub-circuit, and a reverse bias sub-circuit; a pull-up node is at least simultaneously connected to the input sub-circuit, the output sub-circuit, and the first noise reduction sub-circuit; and a pull-down node is at least simultaneously connected to the pull-down control sub-circuit, the pull-down sub-circuit, and the first noise reduction sub-circuit; and the input sub-circuit comprises: at least two first transistors; the output sub-circuit comprises: a third transistor, an eleventh transistor, and a storage capacitor; the pull-down control sub-circuit comprises: a fifth transistor; the pull-down sub-circuit comprises: a sixth transistor and a seventh transistor; the first noise reduction sub-circuit comprises: at least two eighth transistors; the second noise reduction sub-circuit comprises: a thirteenth transistor; the third noise reduction sub-circuit comprises: a twelfth transistor; the first reset sub-circuit comprises: at least two second transistors; the second reset sub-circuit comprises: a fourth transistor; the shift reset sub-circuit comprises: at least two fifteenth transistors; and the reverse bias sub-circuit comprises: a reverse bias control transistor;

control electrodes of the two first transistors are both connected to a signal input terminal, a first one of the first transistors has a first electrode connected to the signal input terminal, and a second electrode connected to a first electrode of a second one of the first transistors and a second electrode of the reverse bias control transistor, and a second electrode of the second one of the first transistors is connected to the pull-up node;

the third transistor has a control electrode connected to the pull-up node, a first electrode connected to a clock signal terminal, and a second electrode connected to a signal output terminal;

the eleventh transistor has a control electrode connected to the pull-up node, a first electrode connected to the clock signal terminal, and a second electrode connected to a cascade signal terminal;

one terminal of the storage capacitor is connected to the pull-up node, and the other terminal of the storage capacitor is connected to the signal output terminal;

a control electrode and a first electrode of the fifth transistor are both connected to a power voltage terminal, and a second electrode of the fifth transistors is connected to the pull-down node;

the sixth transistor has a control electrode connected to the pull-up node, a first electrode connected to a first reference level terminal, and a second electrode connected to the pull-down node;

the seventh transistor has a control electrode connected to the signal input terminal, a first electrode connected to the first reference level terminal, and a second electrode connected to the pull-down node;

control electrodes of the two eighth transistors are both connected to the pull-down node, a first one of the eighth transistors has a first electrode connected to the first reference level terminal, and a second electrode connected to a first electrode of a second one of the eighth transistors and the second electrode of the reverse bias control transistor, and a second electrode of the second one of the eighth transistors is connected to the pull-up node;

the thirteenth transistor has a control electrode connected to the pull-down node, a first electrode connected to a second reference level terminal, and a second electrode connected to the signal output terminal;

the twelfth transistor has a control electrode connected to the pull-down node, a first electrode connected to the first reference level terminal, and a second electrode connected to the cascade signal terminal;

control electrodes of the two second transistors are both connected to a reset signal terminal, a first one of the second transistors has a first electrode connected to the first reference level terminal, and a second electrode connected to a first electrode of a second one of the second transistors and the second electrode of the reverse bias control transistor, and a second electrode of the second one of the second transistors is connected to the pull-up node;

the fourth transistor has a control electrode connected to the reset signal terminal, a first electrode connected to the second reference level terminal, and a second electrode connected to the signal output terminal;

control electrodes of the two fifteenth transistors are both connected to a shift reset signal terminal, a first one of the fifteenth transistors has a first electrode connected to the first reference level terminal, and a second electrode connected to a first electrode of a second one of the fifteenth transistors and the second electrode of the reverse bias control transistor, and a second electrode of the second one of the fifteenth transistors is connected to the pull-up node; and a control electrode and a first electrode of the reverse bias control transistor are connected to the cascade signal terminal, and the second electrode of the reverse bias control transistor is connected to the second electrode of the first one of the first transistors, the second electrode of the first one of the eighth transistors, the second electrode of the first one of the second transistors, and the second electrode of the first one of the fifteenth transistors.

5. A gate driving circuit, comprising a plurality of shift register units cascaded with each other, wherein each of the shift register units is the shift register unit of claim 4.

6. A display device, comprising the gate driving circuit of claim 5.

* * * * *